(12) United States Patent
Walker et al.

(10) Patent No.: US 7,403,030 B2
(45) Date of Patent: Jul. 22, 2008

(54) USING PARAMETRIC MEASUREMENT UNITS AS A SOURCE OF POWER FOR A DEVICE UNDER TEST

(75) Inventors: Ernest Walker, Weston, MA (US); Ron Sartschev, Dunstable, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/016,352

(22) Filed: Dec. 17, 2004

(65) Prior Publication Data

US 2006/0132163 A1 Jun. 22, 2006

(51) Int. Cl.
G01R 31/26 (2006.01)
(52) U.S. Cl. .................... 324/765; 324/158.1
(58) Field of Classification Search ............. 324/763, 324/765, 73.1, 158.1; 714/724–733
See application file for complete search history.

(56) References Cited

U.S. PATENT DOCUMENTS

| | | | |
|---|---|---|---|
| 4,646,299 A | | 2/1987 | Schinabeck et al. |
| 4,998,026 A | * | 3/1991 | King ........................ 326/16 |
| 5,059,889 A | * | 10/1991 | Heaton ...................... 323/285 |
| 5,101,153 A | | 3/1992 | Morong, III |
| 5,200,696 A | | 4/1993 | Menis et al. |
| 5,414,352 A | * | 5/1995 | Tanase .................... 324/158.1 |
| 5,514,976 A | | 5/1996 | Ohmura |
| 5,521,493 A | | 5/1996 | Persons |
| 5,579,236 A | * | 11/1996 | Tamamura et al. ............ 702/64 |
| 5,617,035 A | | 4/1997 | Swapp |
| 5,754,041 A | * | 5/1998 | Kaito et al. .............. 324/158.1 |
| 5,917,331 A | | 6/1999 | Persons |
| 5,955,890 A | * | 9/1999 | Gillette ....................... 326/30 |
| 6,011,403 A | * | 1/2000 | Gillette ...................... 324/763 |
| 6,313,657 B1 | * | 11/2001 | Hashimoto ................. 324/763 |
| 6,429,641 B1 | | 8/2002 | Montrose |
| 6,498,473 B1 | | 12/2002 | Yamabe |
| 6,677,775 B2 | | 1/2004 | Babcock |
| 6,687,868 B1 | | 2/2004 | Furukawa et al. |
| 6,781,364 B2 | * | 8/2004 | Kawasaki et al. ........ 324/158.1 |
| 6,828,775 B2 | | 12/2004 | Chow et al. |
| 6,836,136 B2 | | 12/2004 | Aghaeepour |
| 6,859,902 B1 | | 2/2005 | Dalal et al. |
| 6,879,175 B2 | | 4/2005 | Conner |
| 6,885,213 B2 | * | 4/2005 | Sunter ........................ 324/765 |
| 6,956,393 B1 | * | 10/2005 | Tanaka ....................... 324/763 |
| 7,023,366 B1 | * | 4/2006 | Walker et al. ............... 341/120 |
| 2005/0189950 A1 | | 9/2005 | Lu |

OTHER PUBLICATIONS

Mercury, System on a Chip, 50 MHz Octal Pin Electronics with PMU; Planet ATE; Nov. 22, 2004.
Neptune, SOC Pin Electronics Companion PMU/DAC/Resistive Load; Planet ATE; Jun. 16, 2004.

(Continued)

Primary Examiner—Ha Tran Nguyen
Assistant Examiner—Arleen M Vazquez
(74) Attorney, Agent, or Firm—Fish & Richardson P.C.

(57) ABSTRACT

An apparatus for providing current to a device under test includes a first parametric measurement unit configured to provide current to the device, and a second parametric measurement unit configured to provide current to the device. The current from the second parametric measurement unit augments the current from the first parametric measurement unit at the device.

19 Claims, 5 Drawing Sheets

OTHER PUBLICATIONS

Pluto, Octal PMU/VI with Ganging 5 MHz Pin Electronics; Planet ATE; Oct. 28, 2004.
Saturn, System on a Chip, Dual Channel Wide Voltage Pin Electronics Solution; Planet ATE; Jul. 19, 2005.
Venus, System in a Chip, Dual Channel 133 MHz Pin Electronics Solution; Planet ATE; Sep. 16, 2004.
International Search Report for Application No. PCT/US05/45718, May 1, 2006.
Written Opinion for Application No. PCT/US05/45718, May 1, 2006.
International Preliminary Examination Report, dated Nov. 27, 2007 in corresponding application PCT/US05/45718 (6 pgs.).
Search Report for counterpart Singapore App. No. SG 200703720-3 dated Mar. 12, 2008 (prepared by Australian Patent Office).
Written Opinion for counterpart Singapore App. No. SG 200703720-3 dated Mar. 12, 2008 (prepared by Australian Patent Office).

* cited by examiner

USING PARAMETRIC MEASUREMENT UNITS AS A SOURCE OF POWER FOR A DEVICE UNDER TEST

TECHNICAL FIELD

This patent application relates generally to testing a device and, more particularly, to using parametric measurement units as source of power for the device.

BACKGROUND

Automatic test equipment (ATE) refers to an automated, usually computer-driven, approach to testing devices, such as semiconductors, electronic circuits, and printed circuit board assemblies. A parametric measurement unit (PMU) is typically part of an ATE. A PMU is used during device testing to measure parameters, such as voltage and current, at a device pin, and to regulate those parameters. The PMU attempts to ensure that, during testing, proper parameter values are applied to the device under test (DUT).

The device under test requires power during most testing procedures. Heretofore, a separate power supply was built into the ATE. Use of a separate power supply, however, increases both the cost and the size of the ATE.

SUMMARY

This patent application describes apparatus and methods, including computer program products, for using PMUs as a source of power for a DUT.

In general, in one aspect, the invention is directed to an apparatus for providing current to a DUT. The apparatus includes a first PMU configured to provide current to the device, and a second PMU configured to provide current to the device. The current from second PMU augments the current from the first PMU at the device. Powering the DUT using current from the PMUs eliminates the need for a separate power supply. This is advantageous because it promotes reductions in both the cost and the size of ATE.

This aspect may include one or more of the following features. The apparatus may include one or more additional PMUs configured to provide current to the device. The current from the one or more additional PMUs augments current from the first and second PMUs at the device. The first and second PMUs may have the substantially same structure, which includes a driver for outputting current and a feedback path for regulating current output of the driver. The apparatus may include a third PMU, which is configured to sense a voltage at the DUT. This voltage may be applied as input to the first and second PMUs. The third PMU may be configured to sense the voltage by disabling functionality of the third PMU for outputting current to the DUT (e.g., by tri-stating the third PMU). The apparatus may be part of ATE for testing functions performed by the DUT; the first, second and third PMUs may be implemented on a single chip that is part of the ATE; and the ATE need not include a power supply other than the first and second PMUs.

In general, in another aspect, the invention is directed to an apparatus for applying power to a DUT. The apparatus includes plural PMUs, each of which has substantially the same circuitry. Each of the plural PMUs is configurable to operate as a current source to power the DUT or as a sensing device. The plural PMUs include a first PMU configured to sense a voltage at the device, where the first PMU includes a sense path that taps a voltage at the DUT, and at least one additional PMU configured to operate as a current source. The at least one additional PMU receives voltage via the first PMU and provides output current based on the voltage received via the first PMU. The sense path may be used to ensure a consistent voltage at the DUT while the PMUs power the device with current.

This aspect may include one or more of the following features. The at least one additional PMU may include a second PMU configured to operate as a current source, where the second PMU includes a second driver that outputs current to the DUT, and where the second driver receives the voltage via the first PMU; a third PMU configured to operate as a current source, where the third PMU includes a third driver that outputs current to the DUT, and where the third driver receives the voltage via the first PMU; and/or a fourth PMU configured to operate as a current source, where the fourth PMU includes a fourth driver that outputs current to the DUT, and where the fourth driver receives, as inputs, both an external voltage and a voltage received via the first PMU.

The second, third and fourth PMUs each may include a feedback path. A feedback path of the second PMU may provide an input to the second driver; a feedback path of the third PMU may provide an input to the third driver; and a feedback path of the fourth PMU may provide an input to the fourth driver. The feedback path of the second PMU may tap a voltage between the DUT and the second driver, and the feedback path of the third PMU may tap a voltage between the DUT and the third driver.

The first PMU may be configured to sense a voltage at the device by disabling functionality in the first PMU that enables the first PMU to operate as a current source. The functionality in the first PMU that enables the first PMU to operate as a current source may be present in a driver. The driver may be disabled by tri-stating the driver. The apparatus may be part of an ATE for testing functions performed by the DUT; the plural PMUs may be implemented on a single chip that is part of the ATE; and the ATE may not include a power supply other than the plural PMUs.

In general, in another aspect, the invention is directed to a method of providing current to a DUT. The method includes sensing an output current provided to a DUT, providing a voltage that corresponds to the output current as input to plural PMUs, outputting current from each of the plural PMUs, where the current from each PMU is based on the voltage, and combining currents from the plural PMUs at the DUT. Sensing the current may include configuring a first PMU to sense the output current. The first PMU may provide the voltage to the plural PMUs.

In general, in another aspect, the invention is directed to an apparatus for providing current to a DUT. The apparatus includes a first PMU configured to provide current to the device, and a second PMU configured to provide current to the device, where the current from the second PMU augments the current from the first PMU at the device. A third PMU is configured to sense a voltage at the device. This voltage is input to the first PMU.

The foregoing aspect may include one or more of the following features. The apparatus may be part of an ATE for testing functions performed by the DUT; the first, second and third PMUs may be implemented on a single chip that is part of the ATE, and the ATE may not include a power supply other than the plural PMUs. The apparatus may also include a fourth PMU configured to provide current to the device. Current from the fourth PMU augments the current from the first and second PMUs at the device.

The details of one or more examples are set forth in the accompanying drawings and the description below. Further features, aspects, and advantages of the invention will become apparent from the description, the drawings, and the claims.

DETAILED DESCRIPTION

Figure 1:
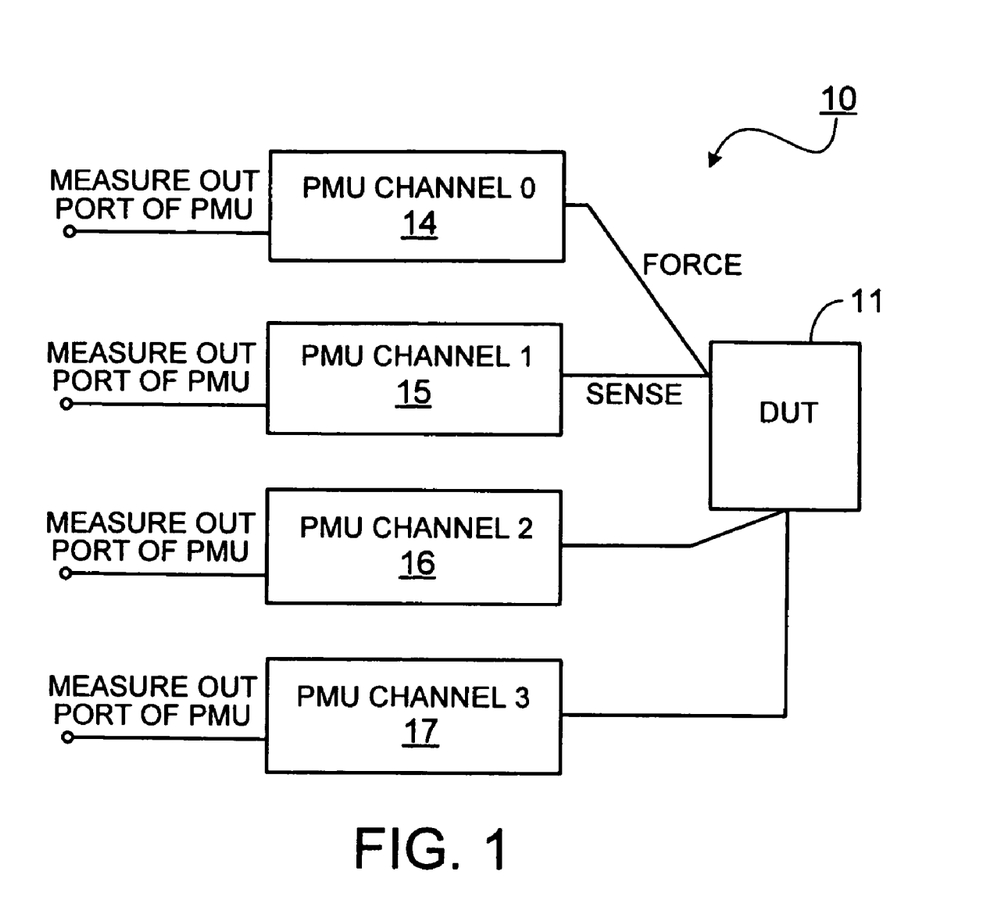
FIG. 1 is a block diagram of PMUs in an ATE.

FIG. 1 is a block diagram of ATE 10 for testing a DUT 11. As shown in FIG. 1, ATE 10 includes four PMUs 14 to 17, which correspond to four testing channels. One function of PMUs 14 to 17 is to test direct current (DC) parameters, including voltage and current, at the DUT. PMUs 14 to 17 may also function as a power source for DUT 11. That is, the current outputs of two or more of PMUs 14 to 17 may be applied to a power pin of DUT 11, thereby powering DUT 11 during testing.

PMUs 14 to 17 have substantially identical structures, meaning that they contain basically the same circuit elements, although those circuit elements may be configured differently. As such, only one PMU is described in detail.

Figure 2:
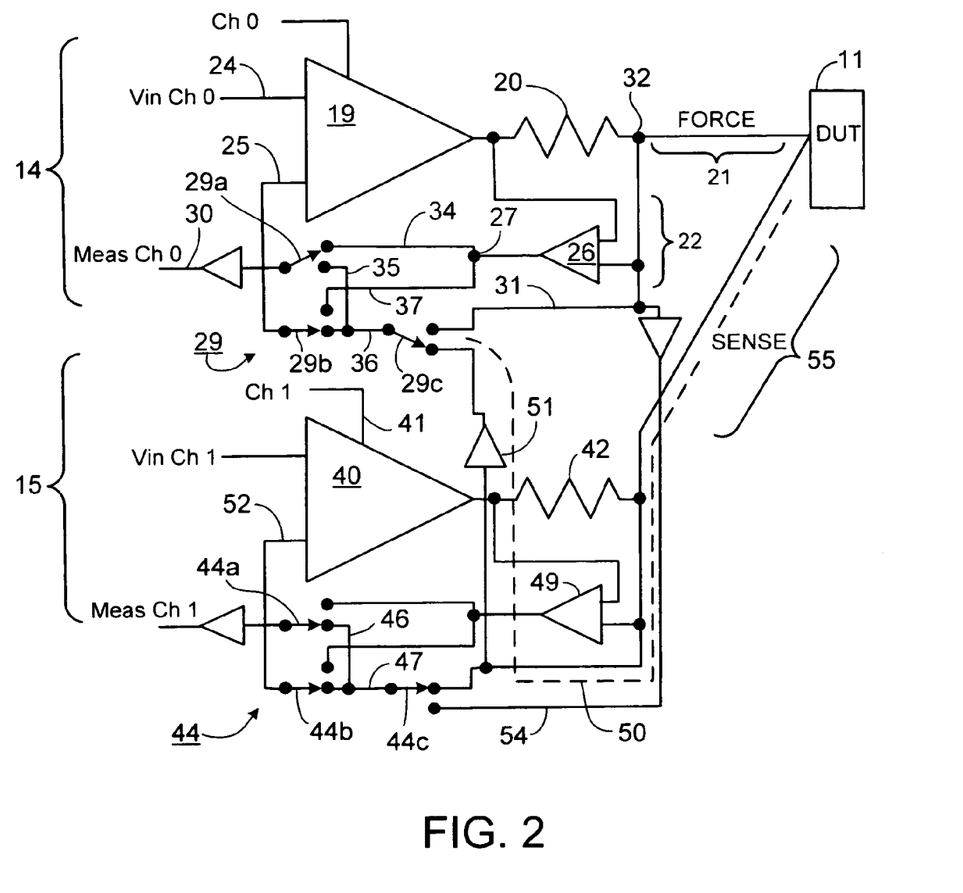
FIG. 2 is a circuit diagram showing two of the PMUs of FIG. 1.

FIG. 2 is a circuit diagram showing one embodiment of PMUs 14 and 15 (referred to herein in as first PMU 14 and second PMU 15). As shown in FIG. 2, first PMU 14 contains a driver 19, a resistor 20, a circuit path 21 to DUT 11, and a feedback path 22.

Driver 19 may be an op-amp or similar device that receives voltages and that outputs (or "forces") a voltage or current to DUT 11 via resistor 20 and circuit path 21. In the "force voltage" mode, driver 19 regulates the voltage output of first PMU 14; and in the "force current" mode, driver 19 regulates the current output of first PMU 14. In both the force voltage and the force current mode, however, a current is output from driver 19.

In this embodiment, first PMU 14 is a high-current device, meaning that driver 19 outputs currents on the order of 50 mA (although PMU 14 may also operate at lower currents). Driver 19 contains two inputs 24 and 25. In this example, first input 24 is for receiving an input voltage, $V_{in}$, from an external source (not shown) and second input 25 is for receiving a sense voltage (described below). Driver 19 regulates its output voltage and current based on a difference between $V_{in}$ and the sense voltage.

Resistor 20 is in the output path of driver 19, and is used in conjunction with feedback path 22 to measure the current output of driver 19. More specifically, the voltage across resistor 20 is measured via a differential amplifier 26 in feedback path 22. The measured voltage is output at point 27. From there, switches 29 (described below) are configured to output the voltage to port 30. Circuitry within the ATE that is external to the PMUs (not shown) knows the resistance of resistor 20 and, by virtue of differential amplifier 26, the voltage drop across resistor 20. From this information, the external circuitry is able to determine the current output of driver 19.

Feedback path 22 also includes voltage sense path 31. Voltage sense path 31 is used to sense the voltage at a point 32 in PMU 14 that is prior to circuit path 21. That is, the voltage at point 32 feeds back to the input 25 of driver 19 when switches 29 are configured appropriately. Through input 25, driver 19 is able to take into account the voltage drop that occurred up to point 32 and to compensate its output for that voltage drop, e.g., to increase its output voltage to compensate for the voltage drop. However, because point 32 is prior to circuit path 21, the voltage drop that occurs over circuit path 21 is not compensated for by feedback path 22. A way of compensating for this voltage drop using the existing PMUs is described below.

In PMU 14, each of switches 29 may be implemented by any electrical and/or mechanical mechanisms that are capable of making the appropriate connections between circuit paths. In this embodiment, switches 29 include switch 29a, switch 29b, and switch 29c. Switch 29a connects between circuit paths 34 and 35; switch 29b connects between circuit paths 36 and 37; and switch 29c connects between circuit paths 50 and 31. When connected to path 34 (the configuration shown in first PMU 14), switch 29a connects the output of amplifier 26 (the "current feedback path") to port 30. This is referred to as the current sense configuration, since it is the switch configuration that enables first PMU 14 to provide an indication that is used to measure the current output of driver 19. The current feedback path is so named because its output (i.e., the voltage output of amplifier 26) is used to determine a current through resistor 20.

Switches 29 may also be configured to define voltage sense configurations. In a first voltage sense configuration, switch 29b is connected to path 36 (the configuration shown in first PMU 14), switch 29c is connected to path 31, and switch 29a is connected to path 35. In this configuration, path 31 (the "voltage feedback path") is drawn to the voltage of point 32, which is passed both to input 25 of driver 19 and to port 30 (via switches 29). As noted above, the voltage at point 32 takes into account the voltage drop of resistor 20, but does not account for the voltage drop resulting from the impedance of circuit path 21.

As shown in FIG. 2, circuit path 21 extends from point 32 to DUT 11. In this embodiment, circuit path 21 has an impedance of about 1 Ω to 4 Ω (in other embodiments, the impedance along circuit path 21 may be more or less than this). This impedance reduces the voltage that amplifier 19 applies to DUT 11. That is, the current from driver 19 passes through circuit path 21, whose impedance causes a voltage drop, which results in a decrease in the voltage applied to DUT 11. For a 50 mA current, the voltage drop is about 50 mV to 200 mV, which can have a significant adverse affect on the testing of DUT 11. To account for, and thus compensate for, the voltage drop of circuit path 21, second PMU 15 is configured to act as a sense path. In this configuration, some functionality of second PMU 15 is disabled in order to ensure that second PMU 15 does not perform PMU functions.

More specifically, driver 40 of second PMU 15 is tri-stated to prevent driver 40 from outputting current and/or voltage to DUT 11. In this regard, a tri-state circuit, such as driver 40, is similar to an ordinary circuit, except that it has an additional input 41 called the "enable" input. When the enable input is "1", the tri-state circuit behaves like a corresponding normal (non-tri-state) circuit. When the enable input is "0", the output of the tri-state circuit (in this case, driver 40) is disconnected from the rest of the circuit. Thus, as here, when driver 40 is tri-stated, its output is disconnected from resistor 42, preventing driver 40 from supplying current and/or voltage to DUT 11.

When driver 40 is tri-stated, second PMU 15 may be configured to act as a sense path for DUT 11. Circuitry (not shown) configures second PMU 15 via one or more control signals applied to switches 44. When second PMU 15 is so configured, switches 44a and 44b are connected to circuit paths 46 and 47, respectively, so as to produce an open circuit at the output of amplifier 49. Switch 44c may be connected to circuit path 50 (shown) or switch 44c may be disconnected from circuit path 50. Circuit path 50 acts as a sense path directly from DUT 11 to first PMU 14. That is, circuit path 50 taps into the voltage at the DUT pin that received forced voltage from first PMU 14. Circuit path 50 has a relatively high impedance and, in its sensing capacity, does not draw significant amounts of current. As a result, there is relatively little voltage drop along circuit path 50. The voltage along circuit path 50 thus substantially corresponds to the voltage at DUT 11.

First PMU 14 taps the voltage of the DUT sense path (i.e., circuit path 50) via switches 29b and 29c. That is, switches 29b and 29c are configured (as shown in first PMU 14) to connect circuit path 50 to the input 25 of driver 19 (switch 29a may also be configured to connect to port 30 and thereby output the DUT voltage at port 30). In this way, the voltage from DUT 11 is applied to input 25 of driver 19. Accordingly, driver 19 can adjust its output to compensate for the voltage drop that occurred in circuit path 21 (in addition to any voltage drop prior to point 32). As shown in FIG. 2, a voltage amplifier 51 may be provided in circuit path 50 to buffer signals.

Figure 3:
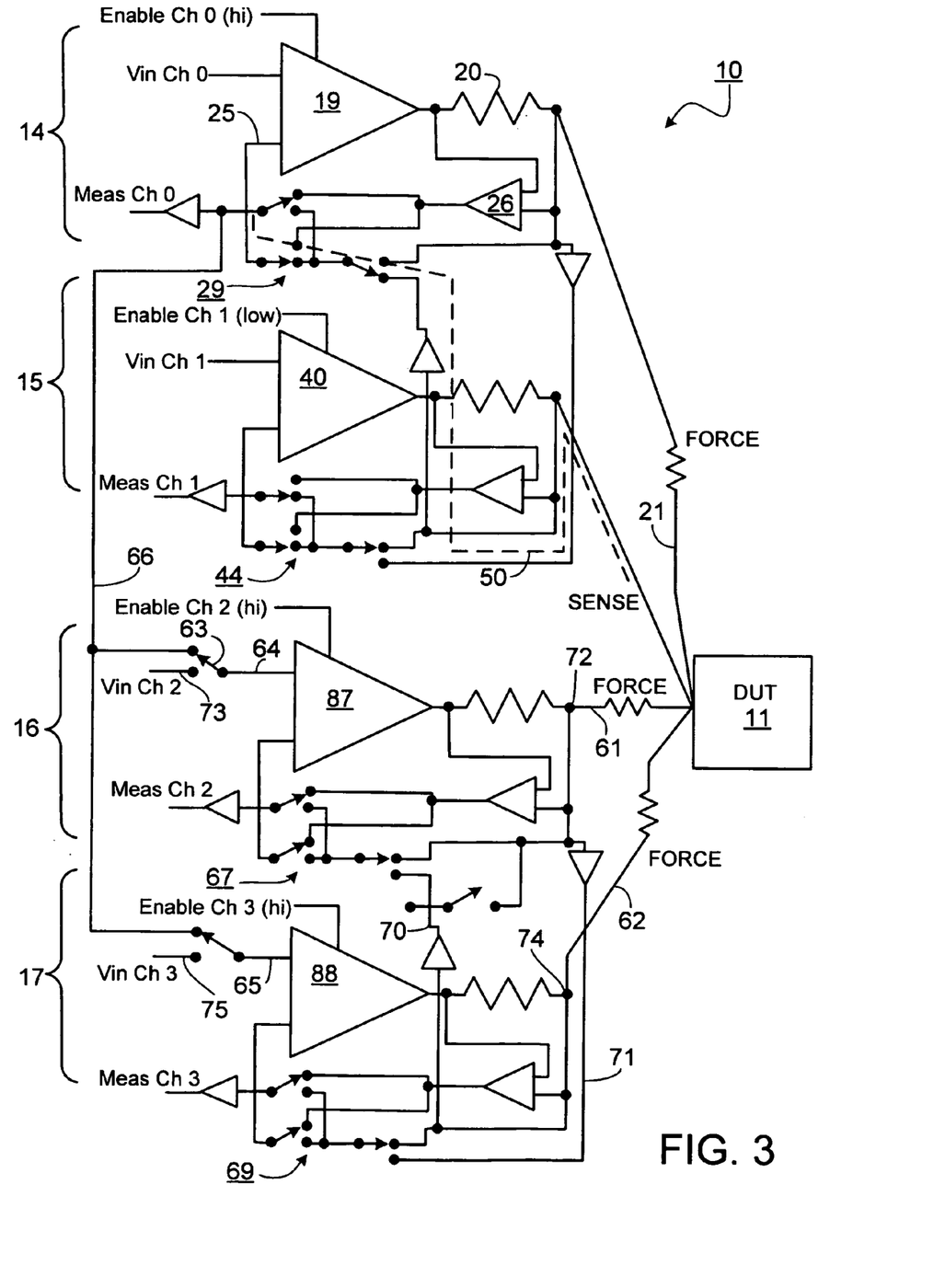
FIG. 3 is a circuit diagram showing the PMUs of FIG. 1 powering the DUT.

In addition to the foregoing, PMUs 14 to 17 may be operated together as a current source to power DUT 11 during testing. FIG. 3 is a circuit diagram showing PMUs 14 to 17 configured to power DUT 11. In this configuration, PMU 14 is in force voltage mode, and PMUs 16 and 17 are in force current mode. In this configuration, current is provided to DUT 11 via output circuit path 21 of first PMU 14, via output circuit path 61 of third PMU 16, and via output circuit path 62 of fourth PMU 17. The currents from the PMUs are supplied to a power pin on DUT 11, where they are combined and used to power DUT 11.

The current from each PMU is supplied to DUT 11 in the manner described above. In the embodiment of FIG. 3, second PMU 15 is configured to provide a voltage sense line for DUT 11, as described above. This is done to maintain the voltage at the power pin at about a predetermined level. If voltage stability at the power pin is not a substantial concern, second PMU 15 may also be used to supply current to the power pin of DUT 11 (i.e., second PMU 15 may not be configured to act as the voltage sense path).

In the embodiment of FIG. 3, circuit path 50 (the DUT sense path) feeds the voltage at DUT 11 back to driver 19, as described above. Amplifier 26 in PMU 14 is used to measure the current in resistor 20 at the output of driver 19, and to convert this current into a voltage. The resulting output voltage is also applied to the input 64 of PMU 16 and the input 65 of PMU 17 via circuit path 66. Thus, the current in the main force PMU 14 is mirrored in PMU's 16 and 17. One or more amplifiers (not shown) may be placed along circuit path 66 to buffer signals applied to inputs 64 and 65. Switches 67 and 69 of PMUs 16 and 17 are configured to disconnect sense paths 70 and 71, and to permit driver current regulation through feedback from points 72 and 74, as described above.

Control circuitry (not shown) may be used to connect PMUs 14 to 17 in the configuration shown in FIG. 3. For example, this control circuitry may control switches 63 and 68 of PMUs 16 and 17 to connect to circuit path 66 rather than to voltage inputs 73 and 75, which are counterparts to $V_{in}$ in PMU 14. As was the case above, switches 63 and 68 may be implemented by any electrical and/or mechanical mechanisms that may be used to make the appropriate connections between circuit paths.

In the embodiment of FIG. 3, PMUs 14, 16 and 17 are each connected to a single power pin on DUT 11. The current from each PMU thus augments the total current supplied to the power pin. So, for example, if each of PMUs 14, 16 and 17 is capable of supplying 50 mA, the aggregate current supplied to the power pin is 150 mA. The amount of current that is supplied to the power pins depends on a number of factors, including the amount of current that each PMU is capable of supplying and the number of PMUs available to supply current. For example, if PMU 15 were configured to supply current rather than to act as a sense path, then the total current that could be supplied to DUT 11 would be 200 mA. On the other hand, PMUs 14 and 15 may be needed for use with a non-power pin on DUT 11, leaving only PMUs 16 and 17 to supply power to the power pin.

In PMUs 16 and 17, switches 67 and 69 are configured, as shown, to connect their respective current feedback paths to drivers 87 and 88. Likewise, circuit path 66 is connected, as shown to the current feedback path of PMU 14. This configuration provides for relatively effective regulation of current output from the PMUs to DUT 11. That is, the amount of current output by each of PMUs 14, 16 and 17 is about the same.

Figure 4:
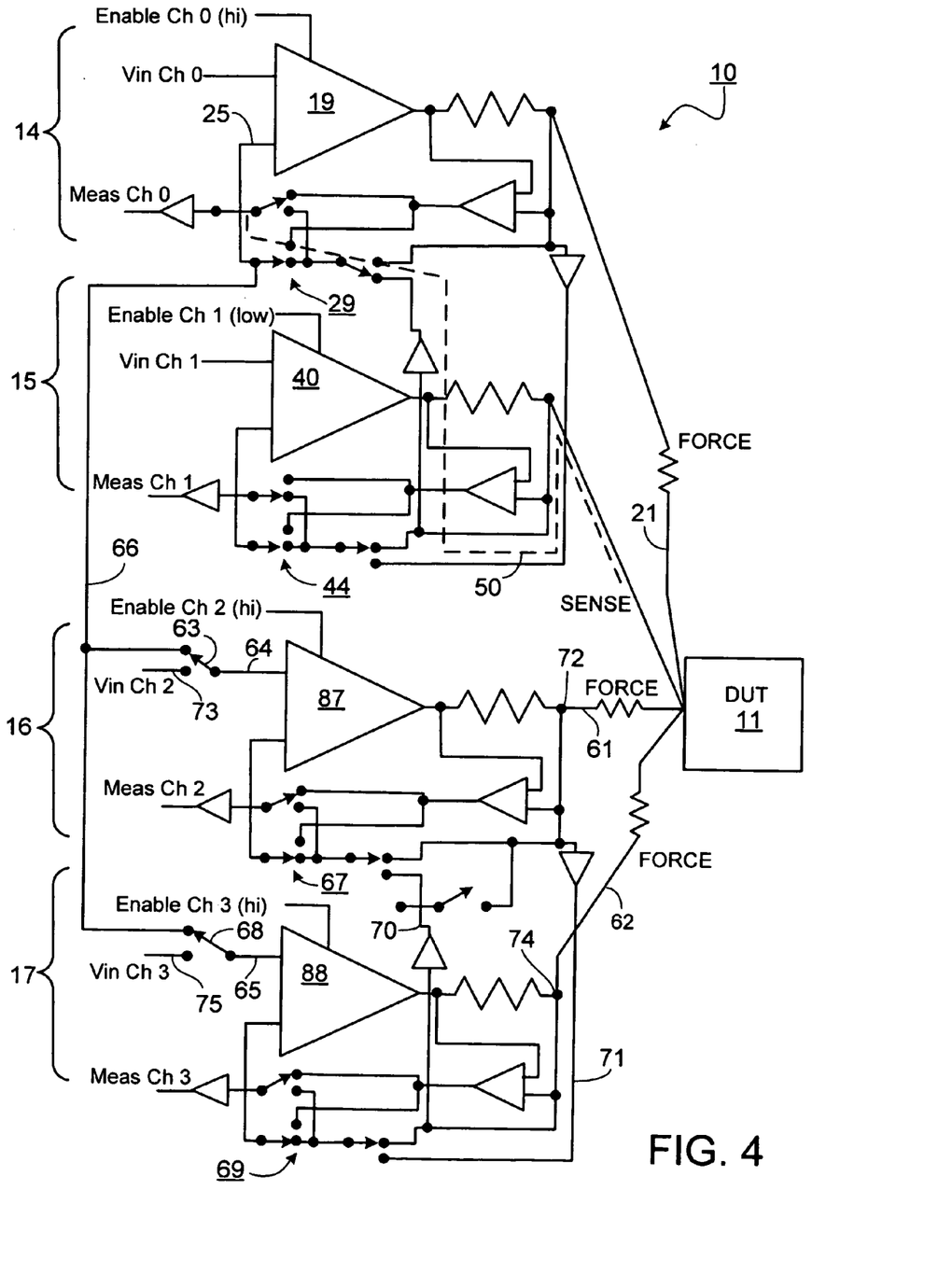
FIG. 4 is an alternate configuration of the circuit diagram shown in FIG. 3.

FIG. 4 shows an alternative configuration of the circuitry of FIG. 3. In this configuration, PMUs 14, 16 and 17 are all in force voltage mode. In the circuitry of FIG. 4, switches 67 and 69 connect the inputs of drivers 87 and 88 to their respective voltage feedback paths, and switches 29 connect circuit path 50, as shown. Circuit path 66 is also connected to the voltage feedback provided by circuit path 50. In this configuration, there may be variations in the amounts of current output by each of PMUs 14, 16 and 17.

It is noted that although only four PMUs are shown in FIG. 3, any number of PMUs may be implemented in an ATE, and may be used to supply power to a DUT.

In this embodiment, PMUs 14 to 16 are implemented on a single chip that is part of the ATE, and the ATE does not include a power supply other than PMUs 14 to 17. Eliminating a separate power supply on the ATE reduces the amount of circuit board space needed to implement the ATE and the cost required to produce the ATE.

Although FIGS. 2 to 4 show second PMU 15 being used as a sense path for first PMU 14, the ATE is not limited as such. That is, second PMU 15 may be configured to force voltage to DUT 11 and first PMU 14 may be configured to act as the sense path for second PMU 15. The functions of first and second PMUs 14 and 15 may changed by reconfiguring their switches 29 and 44 and connecting the feedback path of PMU 15 from DUT 11 to circuit path 66. Referring to FIG. 2, in this alternate configuration, driver 19 is tri-stated, switch 29a is connected to circuit path 35, and switch 29b is connected to current path 36. Switch 29c is connected to circuit path 31 to disconnect circuit path 50 from first PMU 14. Switch 44c is connected to circuit path 54, (the DUT sense line), and switch 44b is connected to apply the voltage therefrom to input 52 of driver 40. Thus, an input 52 of driver 40 receives a voltage from DUT 11, and driver 40 compensates for the voltage drop along circuit path 55 based on this voltage.

Instead of using second PMU 15 as a sense path, third PMU 16 and/or fourth PMU 17 may be used as the sense path. Third PMU 16 and fourth PMU 17 may be configured in the same manner as second PMU 15, described above.

The foregoing embodiments describe PMUs that are implemented using hardware only. In other embodiments, at least part of each of the PMUs may be implemented using software. For example, drivers 19 and 40 may be controlled by a software-based control process. In this example, software may be used to regulate the voltage that is output to DUT 11. That is, the software may receive a sense voltage and control the voltage output to circuit path 21 by first PMU 14 based on this received sense voltage. Thus, if 40V is desired at DUT 11, and the sensed voltage indicates a voltage drop of 80 mV, the software may control first PMU 14 to increase the voltage output to 40V plus 80 mV to compensate for the voltage drop across circuit path 21.

Figure 5:
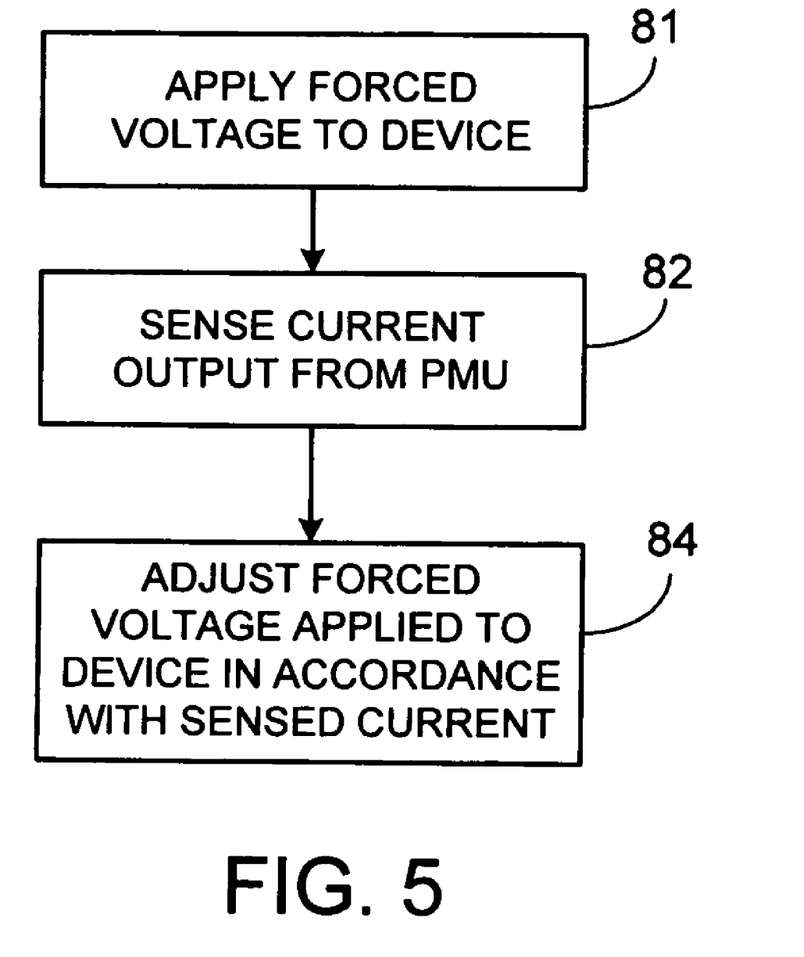
FIG. 5 is a flowchart showing a process for implementing the ATE using software to control voltage forcing and regulation Like reference numerals in different figures indicate like elements.

FIG. 5 is a flowchart showing a process 80 for implementing the ATE using software to control voltage forcing and regulation. Process 80 begins by applying (81) a first voltage to the device. This is done by forcing a voltage to DUT 11. The voltage may be forced by applying control signals to a voltage source, or by any other mechanism. The software knows an impedance of circuit path 21, e.g., the software may be programmed with that impedance beforehand. Process 80 senses (82) a current output of PMU 14 using the voltage from PMU 14's current feedback path. Process 40 adjusts (84) the input voltage applied to driver 19 to compensate for a voltage drop across circuit path 21. That is, process 40 determines the voltage drop based on the current output of driver 19 and the impedance of circuit path 21, and adjusts the driver input voltage accordingly.

The ATE described herein is not limited to use with the hardware and software described above. The ATE can be implemented in digital electronic circuitry, or in computer hardware, firmware, software, or in combinations thereof.

The ATE can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing the ATE can be performed by one or more programmable processors executing one or more computer programs to perform the functions of the ATE. All or part of the ATE can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

In the embodiments described above, amplifiers used to implement drivers and buffers may have a gain of one, although other gains may be used.

Elements of different embodiments described herein may be combined to form other embodiments not specifically set forth above. Other embodiments not specifically described herein are also within the scope of the following claims.

What is claimed is:

1. An apparatus for applying power to a device under test, comprising:
    plural parametric measurement units, the plural parametric measurement units comprising substantially same circuitry, each of the plural parametric measurement units being configurable to operate as a current source to power the device under test or as a sensing device, the plural parametric measurement units comprising:
        a first parametric measurement unit configured to sense a voltage at the device, the first parametric measurement unit comprising a sense path that taps a voltage at a power pin of the device under test; and
        at least two additional parametric measurement units configured to operate as a current source, the at least two additional parametric measurement units being operable in a first mode to provide regulated output current and in a second mode to provide regulated output voltage, the at least two additional parametric measurement units for receiving voltage via the first parametric measurement unit and for providing output current to the power pin of the device under test, the output current being provided based on the voltage received via the first parametric measurement unit.

2. The apparatus of claim 1, wherein the at least two additional parametric measurement units comprise:
    a second parametric measurement unit configured to operate as a current source, the second parametric measurement unit comprising a second driver that outputs current to the power pin of the device under test, the second driver receiving voltage via the first parametric measurement unit; and
    a third parametric measurement unit configured to operate as a current source, the third parametric measurement unit comprising a third driver that outputs current to the power pin of the device under test, the third driver receiving voltage via the first parametric measurement unit.

3. The apparatus of claim 2, wherein the sense path of the first parametric measurement unit leads to inputs of the second and third drivers.

4. The apparatus of claim 2, wherein the at least two additional parametric measurement units comprise:
    a fourth parametric measurement unit configured to operate as a current source, the fourth parametric measurement unit comprising a fourth driver that outputs current to the power pin of the device under test, the fourth driver receiving, as inputs, both an external voltage and a voltage received via the first parametric measurement unit.

5. The apparatus of claim 2, wherein the second parametric measurement unit and the third parametric measurement unit each comprise a feedback path, and
    wherein a feedback path of the second parametric measurement unit provides an input to the second driver, and a feedback path of the third parametric measurement unit provides an input to the third driver.

6. The apparatus of claim 5, wherein the feedback path of the second parametric measurement unit taps a voltage between the device under test and the second driver; and
    wherein the feedback path of the third parametric measurement unit taps a voltage between the device under test and the third driver.

7. The apparatus of claim 1, wherein the first parametric measurement unit is configured to sense a voltage at the device by disabling functionality in the first parametric measurement unit that enables the first parametric measurement unit to operate as a current source.

8. The apparatus of claim 7, wherein the functionality in the first parametric measurement unit that enables the first parametric measurement unit to operate as a current source comprises a driver; and wherein disabling the driver comprises tri-stating the driver.

9. The apparatus of claim 1, wherein the apparatus comprises automatic test equipment for testing functions performed by the device under test; and wherein the automatic test equipment does not include a power supply other than the plural parametric measurement units for powering the device under test.

10. The apparatus of claim 1, further comprising:

a common signal path electrically connecting the at least two additional parametric measurement units, the at least two additional parametric measurement units being configured to receive a signal via the common signal path, the signal for use in controlling current outputs of the at least two additional parametric measurement units so that the current outputs are at predefined values.

11. The apparatus of claim 10, wherein the current outputs have same values.

12. The apparatus of claim 10, wherein the first parametric measurement unit is electrically connected to the common signal path, and wherein the first parametric measurement unit provides the signal to the common signal path.

13. The apparatus of claim 12, wherein the signal is based on the voltage at the power pin of the device.

14. The apparatus of claim 1, wherein the at least two additional parametric measurement units each comprises a voltage sense path that is disabled when the at least two additional parametric measurement units unit provide current to a power pin of the device.

15. A method of providing current to a device under test, comprising:

configuring a first parametric measurement unit to sense a first voltage at a power pin of the device under test through an output path of the first parametric measurement unit;

sensing an output current provided to a device under test by a second parametric measurement unit, the second parametric measurement unit generating the output current based on the first voltage;

providing a voltage that corresponds to the output current as input to plural parametric measurement units;

outputting current from each of the plural parametric measurement units, current from each parametric measurement unit being based on the voltage; and combining currents from the plural parametric measurement units at the power pin of the device under test to thereby provide power to the device under test.

16. The method of claim 15, wherein the plural parametric measurement units are different parametric measurement units than the first and second parametric measurement units.

17. An apparatus that is configurable to operate as a current source to power a device under test, comprising:

a first parametric measurement unit that is operable in a first mode to provide regulated output current and in a second mode to provide regulated output voltage, the first parametric measurement unit being configured to provide current to a power pin of the device in the first mode or the second mode;

a second parametric measurement unit that is operable in the first mode to provide regulated output current and in the second mode to provide regulated output voltage, the second parametric measurement unit being configured to provide current to the power pin of the device in the first mode or the second mode so as to augment the current from the first parametric measurement unit at the power pin of the device with the current from the second parametric measurement unit; and a third parametric measurement unit configured to sense a voltage at the device, the voltage being input to the first parametric measurement unit.

18. The apparatus of claim 17, wherein the apparatus comprises automatic test equipment for testing functions performed by the device under test; and wherein the automatic test equipment does not include a power supply other than the first, second and third parametric measurement units for powering the device under test.

19. The apparatus of claim 17, further comprising:

a fourth parametric measurement unit configured to provide current to the device so as to augment the current from the first parametric measurement unit and the second parametric measurement unit at the power pin of the device with the current from the fourth parametric measurement unit.

* * * * *